US 12,411,406 B2

(12) United States Patent
Raschke (10) Patent No.: US 12,411,406 B2
(45) Date of Patent: Sep. 9, 2025

(54) RETICLE POD INNER POD HAVING DISSIMILAR MATERIAL AT CONTACT SURFACE INTERFACES

(71) Applicant: ENTEGRIS, INC., Billerica, MA (US)

(72) Inventor: Russ V. Raschke, Chanhassen, MN (US)

(73) Assignee: ENTEGRIS, INC., Billerica, MA (US)

( * ) Notice: Subject to any disclaimer, the term of this patent is extended or adjusted under 35 U.S.C. 154(b) by 50 days.

(21) Appl. No.: 18/080,035

(22) Filed: Dec. 13, 2022

(65) Prior Publication Data

US 2023/0194978 A1 Jun. 22, 2023

Related U.S. Application Data

(60) Provisional application No. 63/292,402, filed on Dec. 21, 2021.

(51) Int. Cl.
*G03F 1/66* (2012.01)
(52) U.S. Cl.
CPC ..................... *G03F 1/66* (2013.01)
(58) Field of Classification Search
CPC ............... G03F 1/66; H01L 21/67353; H01L 21/67359
USPC ........................ 206/454, 710, 455
See application file for complete search history.

(56) References Cited

U.S. PATENT DOCUMENTS

| 2003/0218728 A1 | 11/2003 | Del Puerto et al. |
| 2012/0037522 A1 | 2/2012 | Chiu et al. |
| 2015/0266660 A1* | 9/2015 | Lystad ................... B65D 25/10 206/454 |
| 2018/0128372 A1* | 5/2018 | Jones ..................... F16J 15/064 |
| 2018/0210334 A1 | 7/2018 | Hsueh et al. |
| 2019/0101118 A1* | 4/2019 | Lamb ................... F04C 27/005 |
| 2021/0116821 A1 | 4/2021 | Chuang et al. |
| 2021/0327734 A1 | 10/2021 | Raschke et al. |
| 2021/0343563 A1 | 11/2021 | Raschke et al. |

FOREIGN PATENT DOCUMENTS

| CN | 203277341 U | 11/2013 |
| CN | 102789132 B | 7/2014 |
| TW | 202019791 A | 6/2020 |
| TW | 202109181 A | 3/2021 |

* cited by examiner

*Primary Examiner* — Steven A. Reynolds (57) ABSTRACT

Reticle pod inner pods include a cover and a baseplate, with the cover and the baseplate contacting one another at contact surfaces. The contact surfaces of the cover and the baseplate each include different materials. The different materials can each be metals. The different materials can differ in hardness. The difference in hardness can be 50 Brinell hardness or greater. One of the different materials can be a ductile material, having elongation at break of 25% or greater. Methods can include providing the cover and the baseplate each including a first material, and providing a second, different material at the contact surfaces of one of the cover or the baseplate.

6 Claims, 5 Drawing Sheets

RETICLE POD INNER POD HAVING DISSIMILAR MATERIAL AT CONTACT SURFACE INTERFACES

PRIORITY

This disclosure claims priority to U.S. provisional patent No. 63/292,402 with a filing date of Dec. 21, 2021, which is incorporated by reference herein.

FIELD

This disclosure is directed to reticle pods having dissimilar materials at interfacing contact surfaces.

BACKGROUND

Reticle pods can be used to store and convey reticles, for example reticles subjected to photolithography such as extreme ultraviolet (EUV) photolithography. The reticle pods can include outer pods and inner pods. The inner pods can include metals, typically hard metal materials. The inner pods typically include a baseplate and a cover which contact one another when the inner pod is closed, for example when a reticle is contained within.

SUMMARY

This disclosure is directed to reticle pods having dissimilar materials at interfacing contact surfaces.

Contact surfaces of covers and baseplates of reticle pod inner pods can use different materials at the respective contact surfaces. The different materials can differ in hardness to provide a relatively soft and/or ductile material at one of the contact surfaces and a relatively harder material at the other. The difference in hardness between the different materials can be selected to reduce particle generation due to wear and/or the incidence of galling at the contact surfaces. The reduction in particle generation provided by the use of the dissimilar materials can improve yields and reduce damage to or loss of reticles in storage, transportation, and photolithography processes using inner pods according to embodiments.

In an embodiment, a reticle pod includes a baseplate and a cover. The baseplate and the cover configured to accommodate a reticle. The baseplate includes one or more first contact surfaces on a side of the baseplate configured to face the cover. The cover includes one or more second contact surfaces, each of the one or more second contact surfaces configured to contact at least one of the one or more first contact surfaces. The one or more first contact surfaces are formed of a first material. The one or more second contact surfaces are formed of a second material. The second material is different from the first material.

In an embodiment, when the one or more first contact surfaces contact the one or more second contact surfaces, a seal is formed at the interface of the one or more first contact surfaces with the one or more second contact surfaces.

In an embodiment, the first material and the second material differ in hardness by at least 50 Brinell hardness. In an embodiment, one of the first material and the second material is gold, and the other of the first material and the second material is selected from the group consisting of nickel and chrome. In an embodiment, at least one of the first material and the second material are metals. In an embodiment, one of the first material and the second material is provided as a coating on a respective one of the baseplate or the cover. In an embodiment, at least one of the first material or the second material has a ductility value D of 0.62 or greater. In an embodiment, at least one of the first material or the second material is non-oxidizing.

In an embodiment, a method of manufacturing a reticle pod includes forming a baseplate of a first material, where the baseplate includes one or more first contact regions. The method further includes forming a cover of the first material, the cover including one or more second contact regions, where the one or more second contact regions are configured to oppose the one or more first contact regions when the baseplate and the cover are joined. The method also includes applying a second material, different from the first material, to one of the cover or the baseplate at least at the one or more first contact regions or the one or more second contact regions to form a contact surface.

In an embodiment, the first material and the second material differ in hardness by at least 50 Brinell hardness. In an embodiment, the first material is selected from the group consisting of nickel and chrome, and the second material is gold. In an embodiment, each of the first material and the second material are metals. In an embodiment, applying the second material comprises coating the either of the one or more first contact regions or the one or more second contact regions with the second material. In an embodiment, the second material has ductility value D of 0.62 or greater. In an embodiment, the second material is non-oxidizing.

In an embodiment, the method further includes applying a third material, different from the second material, to the other of the cover or the baseplate at least at the one or more first contact regions or the one or more second contact regions to form a second contact surface. In an embodiment, the third material and the second material differ in hardness by at least 50 Brinell hardness. In an embodiment, the third material is selected from the group consisting of nickel and chrome, and the second material is gold. In an embodiment, the third material and the second material are metals. In an embodiment, the third material is non-oxidizing.

In an embodiment, a method of storing a reticle includes placing the reticle into a reticle pod including a cover and a baseplate. The method further includes bringing one or more first contact surfaces provided on the cover into contact with one or more second contact surfaces provided on the baseplate. The one or more first contact surfaces are formed of a first material and the one or more second contact surfaces are formed of a second material. The second material is different from the first material. In an embodiment, the first material and the second material differ in hardness by at least 50 Brinell hardness. In an embodiment, at least one of the first material and the second material has ductility value D of 0.62 or greater. In an embodiment, at least one of the first material and the second material is non-oxidizing.

DETAILED DESCRIPTION

This disclosure is directed to reticle pods having dissimilar materials at interfacing contact surfaces.

Figure 1:
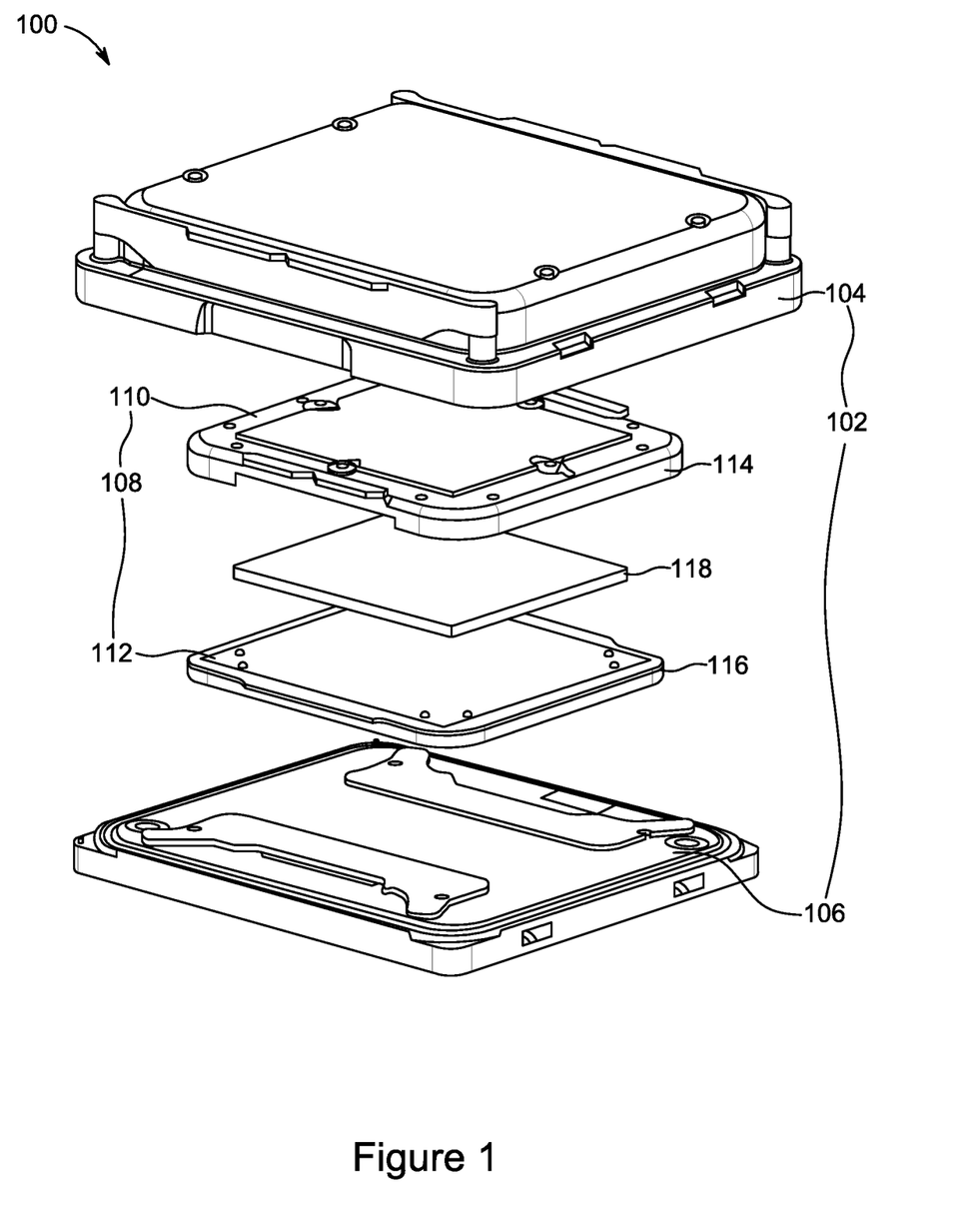
FIG. 1 shows a reticle pod according to an embodiment.

FIG. 1 shows a reticle pod according to an embodiment. Reticle pod 100 includes an outer pod 102 including pod dome 104 and pod door 106. Reticle pod 100 further includes inner pod 108, which includes cover 110 and baseplate 112. Cover 110 includes one or more cover contact surfaces 114. Baseplate 112 includes one or more baseplate contact surfaces 116. Reticle 118 can be contained within the reticle pod 100.

Outer pod 102 forms an exterior of reticle pod 100 when reticle pod 100 is fully assembled. Outer pod 102 is configured to form an internal space capable of accommodating inner pod 108. Outer pod 102 can be formed of pod dome 104 and pod door 106. Pod dome 104 and pod door 106 can be configured to be joined to one another, for example using a latching mechanism (not shown). The pod dome 104 and pod door 106 can be configured such that the inner pod 108 is retained within the internal space defined by the pod dome 104 and pod door 106.

Inner pod 108 is a pod configured to accommodate the reticle 118. Inner pod 108 includes the cover 110 and the baseplate 112. When inner pod 108 is assembled, the cover 110 and the baseplate 112 contact one another at the respective cover contact surfaces 114 and baseplate contact surfaces 116. The inner pod 108 is configured such that it can fit within the internal space of outer pod 102.

Cover 110 forms a portion of inner pod 108. Cover 110 can be formed of any suitable material, for example a metal material such as aluminum. Cover 110 can include a coating or plating on the base material. The cover 110 includes cover contact surfaces 114. The cover contact surfaces 114 are disposed on a side of cover 110 that faces baseplate 112 when the inner pod 108 is assembled. In an embodiment, the cover contact surfaces 114 are provided as a single continuous surface. In an embodiment, the cover contact surfaces 114 are formed of the base material of the cover 110. In an embodiment, the cover contact surfaces 114 are plated and/or coated with a material. In an embodiment, the cover contact surfaces 114 are a plurality of discrete contact surfaces. In an embodiment, cover contact surfaces 114 are provided on a plurality of contact strips, such as contact strips 308 shown in FIG. 3 and described below. In an embodiment, cover contact surfaces 114 are provided on a plurality of contact points such as contact strips 408 shown in FIG. 4 and described below. In an embodiment, cover contact surfaces 114 are provided on one or more contact inserts such as contact inserts 508 as shown in FIG. 5 and described below.

Baseplate 112 forms another portion of inner pod 108. Baseplate 112 can be formed of any suitable material, for example a metal material such as aluminum. Baseplate 112 can include a coating or plating on the base material. The baseplate 112 includes baseplate contact surfaces 116. In an embodiment, the baseplate contact surfaces 116 are formed of the base material of the baseplate 112. In an embodiment, the baseplate contact surfaces 116 are plated and/or coated with a material. The baseplate contact surfaces 116 are disposed on a side of baseplate 112 that faces baseplate 112 when the inner pod 108 is assembled. In an embodiment, the baseplate contact surfaces 116 are provided as a single continuous surface. In an embodiment, the baseplate contact surfaces 116 are a plurality of discrete contact surfaces. In an embodiment, baseplate contact surfaces 116 are provided on a plurality of contact strips, such as contact strips 308 shown in FIG. 3 and described below. In an embodiment, baseplate contact surfaces 116 are provided on a plurality of contact points such as contact strips 408 shown in FIG. 4 and described below. In an embodiment, baseplate contact surfaces 116 are provided on one or more contact inserts such as contact inserts 508 as shown in FIG. 5 and described below. In an embodiment, the cover contact surfaces 114 and the baseplate contact surfaces 116 are configured such that a seal is formed when reticle pod 100 is assembled. The seal can be sufficient to maintain a pressure difference between an interior of the reticle pod inner pod 108 and an exterior of inner pod 108 under conditions such as when a vacuum is drawn external to inner pod 108 or the like. In an embodiment, the seal is formed by direct contact or close proximity between the cover contact surfaces 114 and the baseplate contact surfaces 116, as possible based on manufacturing tolerances, wear, or other such variances.

The cover contact surfaces 114 and baseplate contact surfaces 116 are respectively formed such that dissimilar materials are in contact at the interface between the cover contact surfaces 114 and baseplate contact surfaces 116. The dissimilar materials can be any two different materials that are different from one another. In an embodiment, the dissimilar materials can be selected to include a relatively hard material and a relatively soft material. Non-limiting examples of the relatively hard material include nickel, chrome, diamond-like coatings (DLC), chromium carbon nitride, and/or other materials of similar hardness. Non-limiting examples of the relatively soft material include gold, platinum, and other materials of similar hardness. In an embodiment, the dissimilar materials are selected to have a difference in hardness sufficient to avoid galling, for example by having a difference in hardness of at least 50 Brinell hardness (HB). In an embodiment, at least one of the dissimilar materials is a ductile material, having a physical ductility value D of 0.62 or greater. Non-limiting examples of ductile materials include aluminum, copper, tin, silver, platinum, niobium, lead, and gold. In embodiments, ductility can be characterized by the elongation at break of the material. In an embodiment, both of cover contact surface 114 and baseplate contact surface 116 include a ductile material. In an embodiment, only one of cover contact surface 114 and baseplate contact surface 116 includes the ductile material. In an embodiment, one or both of the materials of cover contact surface 114 and baseplate contact surface 116 is a metal. In an embodiment, at least one of the materials of the cover contact surface 114 or baseplate contact surface 116 is a polymer or composite material. A non-limiting example of a polymer material is a polyether-ether-ketone (PEEK) material, which can be included in a composite material such as a filled PEEK material. In embodiments, the materials selected to be the dissimilar materials at cover contact surface 114 and baseplate contact surface 116 can be selected based on wear properties of the materials such as particle generation, visible wear over use cycles, or the like. The wear properties can be determined for the materials and used in their selection individually or in combination with one another.

Figure 2:
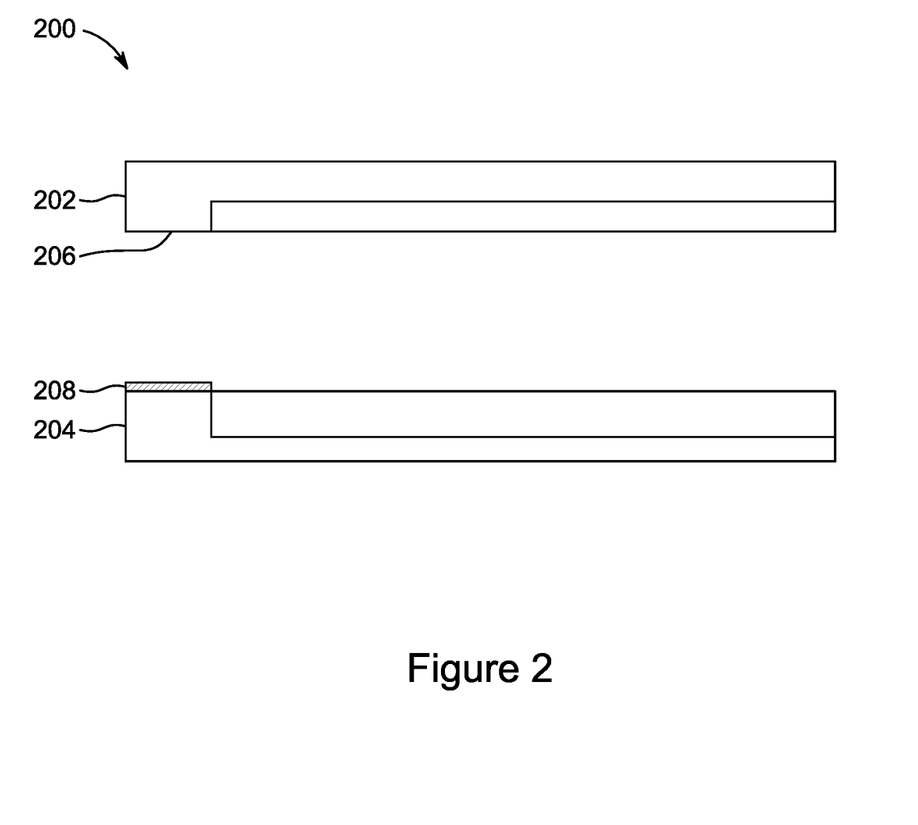
FIG. 2 shows a sectional view of contact surfaces of a reticle pod inner pod according to an embodiment.

FIG. 2 shows a sectional view of contact surfaces of a reticle pod inner pod according to an embodiment. Reticle pod inner pod 200 includes cover 202 and baseplate 204. Cover 202 includes cover contact surface 206. Baseplate 204 includes baseplate contact surface 210. The cover contact surface 206 and the baseplate contact surface 208 are configured to contact one another when reticle pod inner pod 200 is assembled.

Cover 202 forms a portion of reticle pod inner pod 200. Cover contact surface 206 is provided where cover 202 is configured to contact baseplate 204 when reticle pod inner pod 200 is assembled. In the embodiment shown in FIG. 2, the cover contact surface 206 provides the base material of cover 202 where cover 202 contacts baseplate 204. In embodiments, cover contact surface 206 can instead be coated or plated as shown for baseplate contact surface 208 to provide the material at the interface with baseplate contact surface 208.

Baseplate 204 forms another portion of reticle inner pod 200. Baseplate contact surface 208 is provided where baseplate 204 contacts cover 202 when reticle inner pod 200 is assembled. In the embodiment shown in FIG. 2, the baseplate contact surface 208 is coated or plated with a material. The coating at baseplate contact surface 208 is a dissimilar materials form that provided at cover contact surface 206. In other embodiments, cover contact surface 206 can be coated or plated with a material, in addition to or in place of the coating provided on baseplate contact surface 208 as shown in FIG. 2, so long as the material at cover contact surface 206 and baseplate contact surface 208 are dissimilar to one another. The dissimilar materials can differ in ductility, hardness, or the like as discussed above.

Cover contact surface 206 and baseplate contact surface 208 can be configured to provide dissimilar materials where the cover and baseplate contact surfaces 206, 208 meet one another. In an embodiment, one of the dissimilar materials can be a base material of one of the cover or the baseplate. In an embodiment, at least one of the dissimilar materials can be a coating or plating applied to cover 202 or baseplate 204. In an embodiment, both cover 202 and baseplate 204 can each have one of the dissimilar materials applied as a coating or plating, as shown for baseplate contact surface 208 in FIG. 2. In an embodiment, one of cover contact surface 206 or baseplate contact surface 208 is a coating or plating applied to cover 202 or baseplate 204, and the other of cover contact surface 206 or baseplate contact surface 208 is provided as contact strips such as contact strips 308 shown in FIG. 3 and described below. In an embodiment, one of cover contact surface 206 or baseplate contact surface 208 is a coating or plating applied to cover 202 or baseplate 204, and the other of cover contact surface 206 or baseplate contact surface 208 is provided as contact strips such as contact points 408 shown in FIG. 4 and described below. In an embodiment, one of cover contact surface 206 or baseplate contact surface 208 is a coating or plating applied to cover 202 or baseplate 204, and the other of cover contact surface 206 or baseplate contact surface 208 is provided as contact strips such as contact inserts 508 shown in FIG. 5 and described below.

Figure 3:
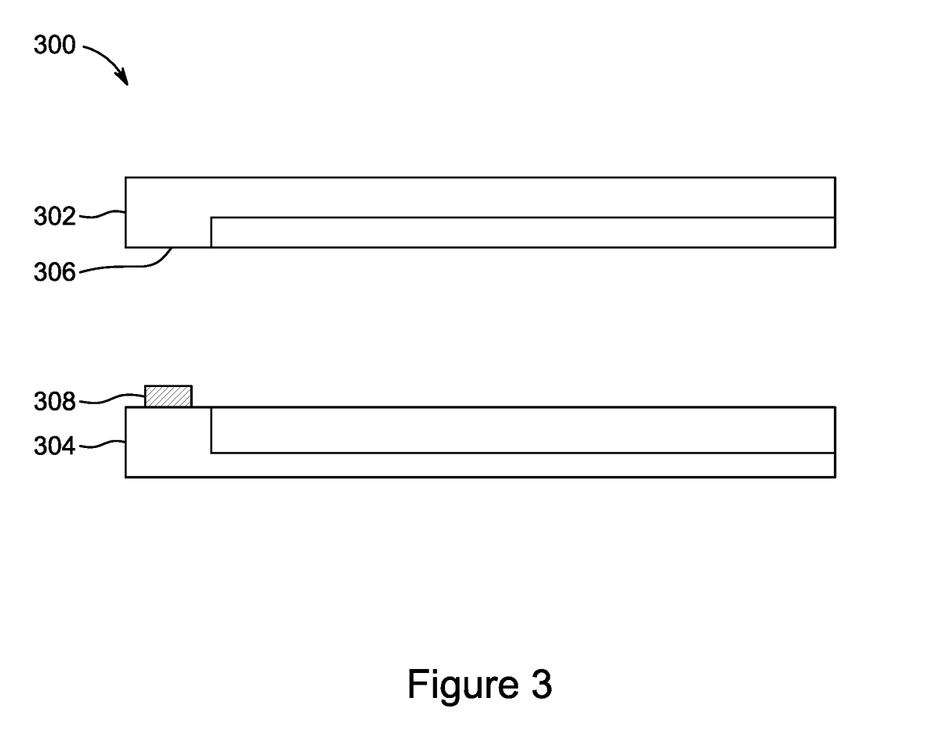
FIG. 3 shows a sectional view of contact surfaces of a reticle pod inner pod according to an embodiment.

FIG. 3 shows a sectional view of contact surfaces of a reticle pod inner pod according to an embodiment. Reticle pod inner pod 300 includes cover 302 and baseplate 304. Cover 302 includes cover contact surface 306. Baseplate 304 includes a plurality of contact strips 308 formed on baseplate 304.

Cover 302 forms a portion of reticle pod inner pod 300. Cover contact surface 306 is provided on cover 302 where cover 302 is configured to contact baseplate 304, for example at locations corresponding to contact strips 308 when cover 302 and baseplate 304 are combined to form reticle pod inner pod 300. In an embodiment, cover contact surface 306 is a base material. In an embodiment, cover contact surface 306 includes a coating or plating as the material presented at the cover contact surface 306.

Baseplate 304 forms another portion of reticle pod inner pod 300. Contact strips 308 are strips of additional material formed on the baseplate 304. The additional material is a material dissimilar to the material at cover contact surface 306. The contact strips 308 can be directly applied to baseplate 304, for example depositing the contact strips 308.

In an embodiment, the contact strips 308 can be attached through any suitable attachment, such as adhesives or the like.

While FIG. 3 shows the contact strips 308 as being formed on baseplate 304, the contact strips 308 can instead be formed on the cover 302, and baseplate 304 can instead provide contact surfaces of base material of the baseplate 304, a coating provided on the baseplate 304, or the baseplate can include contact points such as contact points 408 as discussed below and shown in FIG. 4, or one or more contact inserts such as contact insert 508 as discussed below and shown in FIG. 5.

Figure 4:
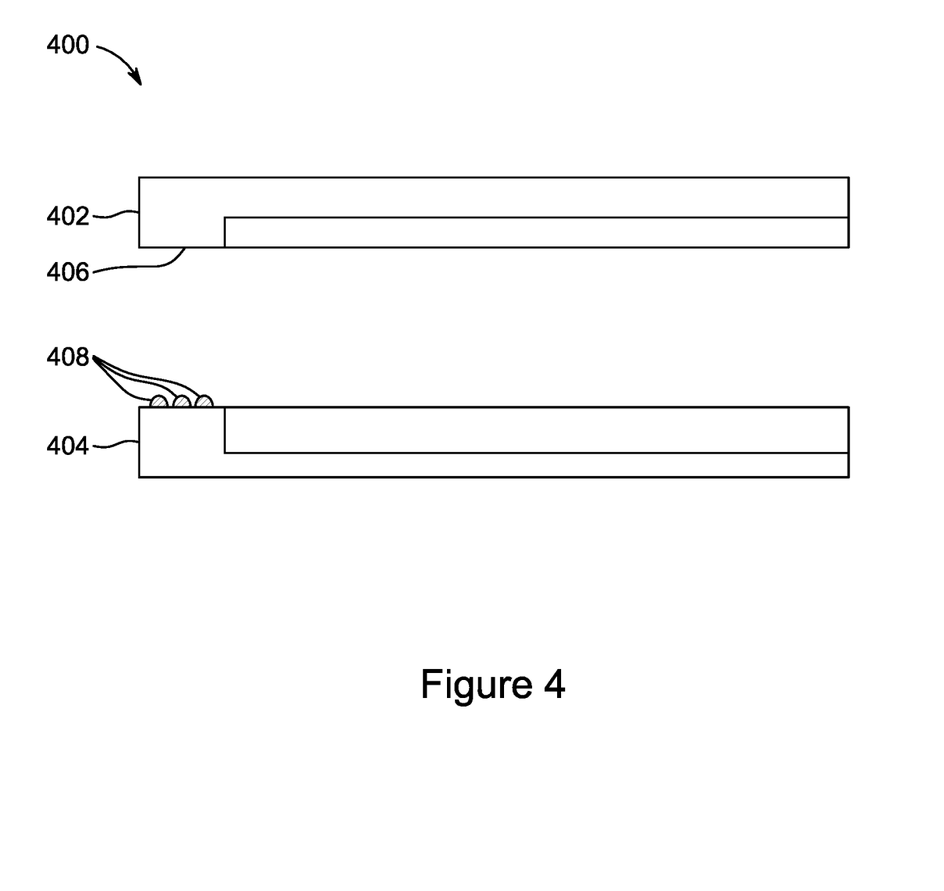
FIG. 4 shows a view of contact surfaces of a reticle pod inner pod according to an embodiment.
Figure 5:
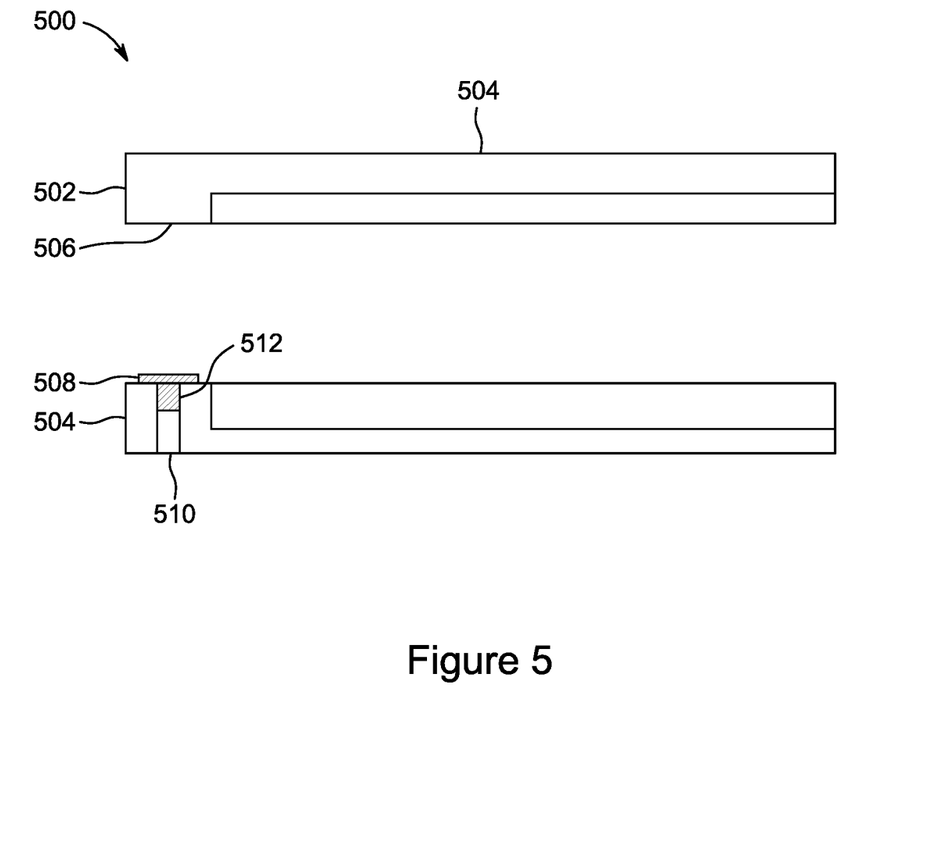
FIG. 5 shows a sectional view of contact surfaces of a reticle pod inner pod according to an embodiment.

FIG. 4 shows a sectional view of contact surfaces of a reticle pod inner pod according to an embodiment. Reticle pod inner pod 400 includes cover 402 and baseplate 404. Cover 402 includes cover contact surface 406. Baseplate 404 includes a plurality of contact points 408 formed on baseplate 404.

Cover 402 forms a portion of reticle pod inner pod 400. Cover contact surface 406 is provided on cover 402 where cover 402 is configured to contact baseplate 404, for example at locations corresponding to contact points 408 when cover 402 and baseplate 404 are combined to form reticle pod inner pod 400. In an embodiment, cover contact surface 406 is a base material. In an embodiment, cover contact surface 406 includes a coating or plating as the material presented at the cover contact surface 406.

Baseplate 404 forms another portion of reticle pod inner pod 400. Contact points 408 are provided on baseplate 404. Contact points 408 are arranged such that the cover contact surface 406 contacts the baseplate 404 at the contact points 408 when baseplate 404 and cover 402 are joined together to form reticle pod inner pod 400. Contact points 408 can be a series of discrete formed on the baseplate 404. Contact points 408 can be shapes such as dots, squares, or the like. Contact points 408 can be arranged in an array on the baseplate 404. Contact points 408 are formed of a material dissimilar to the material at cover contact surface 406.

While FIG. 4 shows the contact points 408 as being formed on baseplate 404, contact points 408 can instead be formed on cover 402, with baseplate 404 providing contact surfaces of bare material or a plating or coating as for baseplate contact surfaces 208 as shown in FIG. 2 and discussed above, contact strips 308 as shown in FIG. 3 and discussed above, and/or contact inserts 508 as described below and shown in FIG. 5. The contact points 408 and the material of cover 402 or baseplate 404 contacted by said contact points 408 are dissimilar materials.

FIG. 5 shows a view of contact surfaces of a reticle pod inner pod according to an embodiment. Reticle pod inner pod 500 includes cover 502 and baseplate 504. Cover 502 includes cover contact surface 506. Baseplate 504 includes a plurality of contact inserts 508 provided on baseplate 504. Contact inserts 510 can be joined to the baseplate 504 using channels 510.

Cover 502 forms a portion of reticle pod inner pod 500. Cover contact surface 506 is provided on cover 502 where the cover 502 is configured to contact baseplate 504 when reticle pod inner pod 500 is assembled. The cover contact surface 506 can be a base material of the cover 502, a coating or plating, or any other suitable contact surface, for example, contact strips such as contact strips 308 as shown in FIG. 3 and described above or contact points 408 as shown in FIG. 4 and described above.

Baseplate 504 forms another portion of reticle pod inner pod 500. Baseplate 504 includes contact inserts 508 provided on baseplate 504. The contact inserts 508 are fixed to baseplate 504, for example, through mechanical engagement such as interfacing features or a press fit between portions of the contact inserts 504 and portions of the baseplate. In an embodiment, channels 510 can receive a portion of contact inserts 508 to retain the contact inserts 508 in place. The channels 510 can be depressions or grooves formed in a surface of baseplate 504. In an embodiment, the channels 510 can be through holes formed in the baseplate 504. In an embodiment, channels 510 are sized such that retention protrusions 512 formed on contact inserts 508 opposite the side configured to contact cover contact surface 506 are press-fit within channels 510 to retain contact inserts 508 in place on baseplate 504. In an embodiment, the retention protrusions 512 can be fixed to the channels 510 using an adhesive. In an embodiment, the retention protrusions 512 include retention features that engage with the baseplate 504 to retain the contact inserts 508 in place on baseplate 504. Cover contact surfaces 506 and contact inserts 508 are made of materials selected such that the contacting portions of cover contact surfaces 506 and contact inserts 508 respectively are formed of dissimilar materials to one another.

While FIG. 5 shows the contact inserts 508 and channels 510 being provided on baseplate 504, in embodiments, the channels 510 can be formed in cover 502 and contact inserts 508 provided on cover 502. In these embodiments, baseplate 504 can instead provide contact surfaces of base material of the baseplate 504, a coating provided on the baseplate 504, or the baseplate 504 can include contact strips such as contact points 308 as discussed above and shown in FIG. 3, or one or contact points such as contact points 408 as discussed above and shown in FIG. 4.

Aspects:

It is understood that any of aspects 1-8 can be combined with any of aspects 9-20.

Aspect 1. A reticle pod, comprising:
a baseplate and a cover, the baseplate and the cover configured to accommodate a reticle, wherein:
the baseplate includes one or more first contact surfaces on a side of the baseplate configured to face the cover;
the cover includes one or more second contact surfaces, each of the one or more second contact surfaces configured to contact at least one of the one or more first contact surfaces;
the one or more first contact surfaces are formed of a first material;
the one or more second contact surfaces are formed of a second material, the second material being different from the first material.

Aspect 2. The reticle pod according to aspect 1, wherein when the one or more first contact surfaces contact the one or more second contact surfaces, a seal is formed at the interface of the one or more first contact surfaces with the one or more second contact surfaces.

Aspect 3. The reticle pod according to any of aspects 1-2, wherein the first material and the second material differ in hardness by at least 50 Brinell hardness.

Aspect 4. The reticle pod according to any of aspects 1-3, wherein one of the first material and the second material is gold, and the other of the first material and the second material is selected from the group consisting of nickel and chrome.

Aspect 5. The reticle pod according to any of aspects 1-4, wherein each of the first material and the second material are metals.

Aspect 6. The reticle pod according to any of aspects 1-5, wherein one of the first material and the second material is provided as a coating on a respective one of the baseplate or the cover.

Aspect 7. The reticle pod according to any of aspects 1-6, wherein at least one of the first material or the second material has a ductility value D of 0.62 or greater.

Aspect 8. The reticle pod according to any of aspects 1-7, wherein at least one of the first material or the second material is non-oxidizing.

Aspect 9. A method of manufacturing a reticle pod, comprising:
forming a baseplate of a first material, the baseplate including one or more first contact regions;
forming a cover of the first material, the cover including one or more second contact regions, the one or more second contact regions configured to oppose the one or more first contact regions when the baseplate and the cover are joined; and
applying a second material, different from the first material, to one of the cover or the baseplate at least at the one or more first contact regions or the one or more second contact regions to form a contact surface.

Aspect 10. The method according to aspect 9, wherein the first material and the second material differ in hardness by at least 50 Brinell hardness.

Aspect 11. The method according to any of aspects 9-10, wherein the first material is selected from the group consisting of nickel and chrome, and the second material is gold.

Aspect 12. The method according to any of aspects 9-11, wherein each of the first material and the second material are metals.

Aspect 13. The method according to any of aspects 9-12, wherein applying the second material comprises coating the either of the one or more first contact regions or the one or more second contact regions with the second material.

Aspect 14. The method according to any of aspects 9-13, wherein the second material has ductility value D of 0.62 or greater.

Aspect 15. The method according to any of aspects 9-14, wherein the second material is non-oxidizing.

Aspect 16. The method according to any of aspects 9-15, further comprising applying a third material, different from the second material, to the other of the cover or the baseplate at least at the one or more first contact regions or the one or more second contact regions to form a second contact surface.

Aspect 17. A method of storing a reticle, comprising:
placing the reticle into a reticle pod including a cover and a baseplate, and
bringing one or more first contact surfaces provided on the cover into contact with one or more second contact surfaces provided on the baseplate, wherein the one or more first contact surfaces are formed of a first material and the one or more second contact surfaces are formed of a second material, the second material being different from the first material.

Aspect 18. The method according to aspect 17, wherein the first material and the second material differ in hardness by at least 50 Brinell hardness.

Aspect 19. The method according to any of aspects 17-18, wherein at least one of the first material and the second material has ductility value D of 0.62 or greater.

Aspect 20. The method according to any of aspects 17-19, wherein at least one of the first material and the second material is non-oxidizing.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A container, comprising:
a reticle pod including:
a baseplate and a cover, the baseplate and the cover configured to accommodate a reticle, wherein:
the baseplate includes one or more first contact surfaces on a side of the baseplate configured to face the cover;
the cover includes one or more second contact surfaces, each of the one or more second contact surfaces configured to contact at least one of the one or more first contact surfaces;
the one or more first contact surfaces are formed of a first material;
the one or more second contact surfaces are formed of a second material, the second material being different from the first material,
wherein one of the first material and the second material is provided as a coating on a respective one of the baseplate or the cover and wherein each of the first material and the second material are metals.

2. The reticle pod of claim 1, wherein when the one or more first contact surfaces contact the one or more second contact surfaces, a seal is formed at the interface of the one or more first contact surfaces with the one or more second contact surfaces.

3. The reticle pod of claim 1, wherein the first material and the second material differ in hardness by at least 50 Brinell hardness.

4. The reticle pod of claim 1, wherein one of the first material and the second material is gold, and the other of the first material and the second material is selected from the group consisting of nickel and chrome.

5. The reticle pod of claim 1, wherein at least one of the first material or the second material has a ductility value D of 0.62 or greater.

6. The reticle pod of claim 1, wherein at least one of the first material or the second material is non-oxidizing.

* * * * *